United States Patent
Nakano

(10) Patent No.: US 8,362,844 B2
(45) Date of Patent: Jan. 29, 2013

(54) DELAY CIRCUIT AND VOLTAGE CONTROLLED OSCILLATION CIRCUIT

(75) Inventor: Fumio Nakano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 129 days.

(21) Appl. No.: 12/974,782

(22) Filed: Dec. 21, 2010

(65) Prior Publication Data

US 2011/0148540 A1    Jun. 23, 2011

(30) Foreign Application Priority Data

Dec. 22, 2009    (JP) .................................. 2009-290961

(51) Int. Cl.
*H03K 3/03* (2006.01)

(52) U.S. Cl. .............. 331/57; 331/16; 331/185; 331/186

(58) Field of Classification Search .................... 331/16, 331/17, 57, 185, 186; 327/108, 110, 113
See application file for complete search history.

(56) References Cited

U.S. PATENT DOCUMENTS

| 5,939,904 | A * | 8/1999 | Fetterman et al. .............. 327/67 |
| 7,236,018 | B1 * | 6/2007 | Wang et al. .................... 327/108 |
| 2007/0236298 | A1 * | 10/2007 | Yamaguchi et al. ............ 331/57 |
| 2010/0214032 | A1 * | 8/2010 | Hinrichs ......................... 331/57 |

FOREIGN PATENT DOCUMENTS

JP    9-223965 A    8/1997

* cited by examiner

*Primary Examiner* — Joseph Chang
*Assistant Examiner* — Jeffrey Shin
(74) *Attorney, Agent, or Firm* — Foley & Lardner LLP

(57) ABSTRACT

A delay circuit includes a delay unit having a first and a second power supply terminals, a pair of differential signal input terminals and a pair of differential signal output terminals. The signals entered to the pair of differential signal input terminals are delayed and output at the pair of differential signal output terminals. The delay circuit also includes a current controller that exercises control to cause a current of a current source, controlled by a current control terminal, to flow through the first and second power supply terminals of the delay unit. The delay circuit also includes a voltage controller that exercises control to provide for a constant potential difference between the first and the second power supply terminals (FIG. 1).

12 Claims, 10 Drawing Sheets

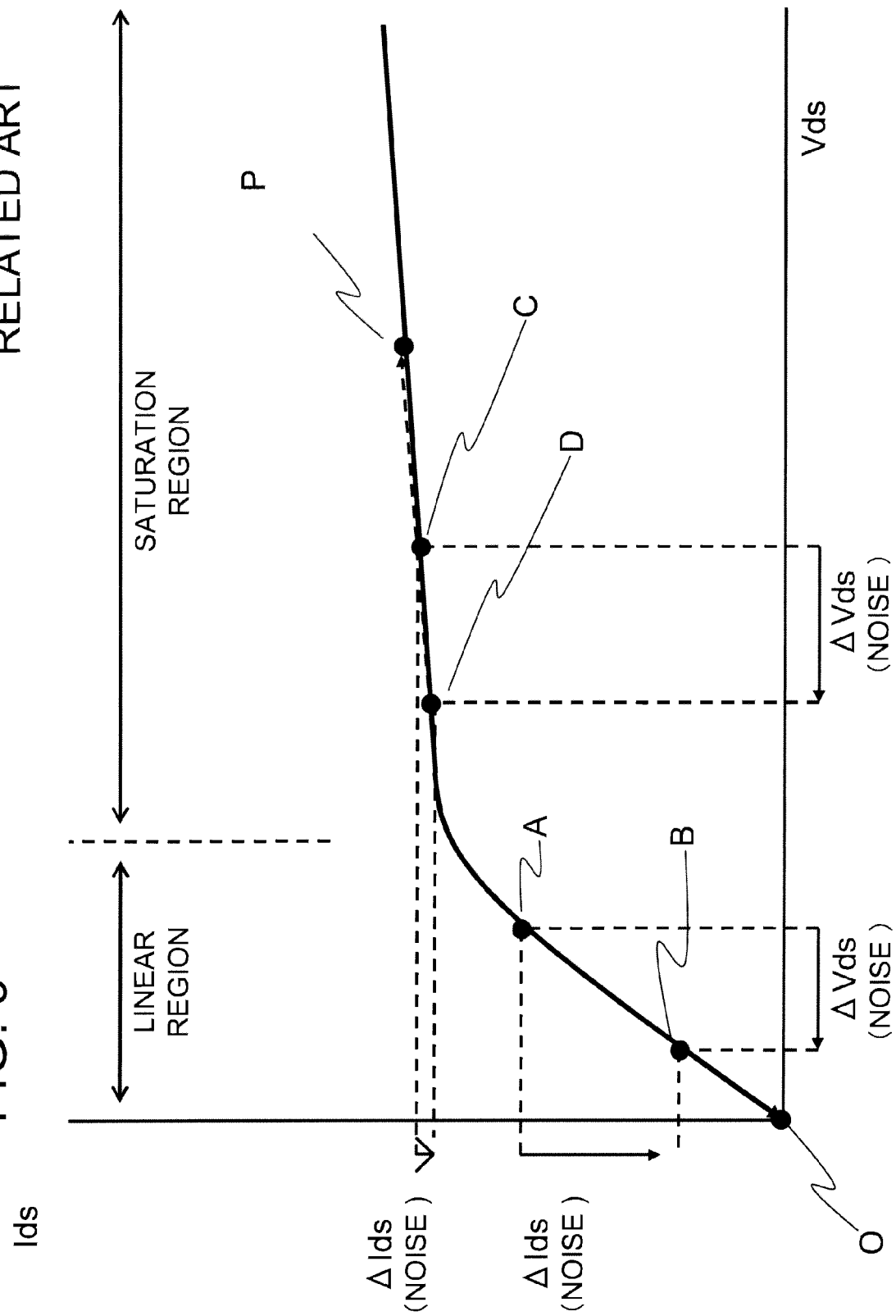

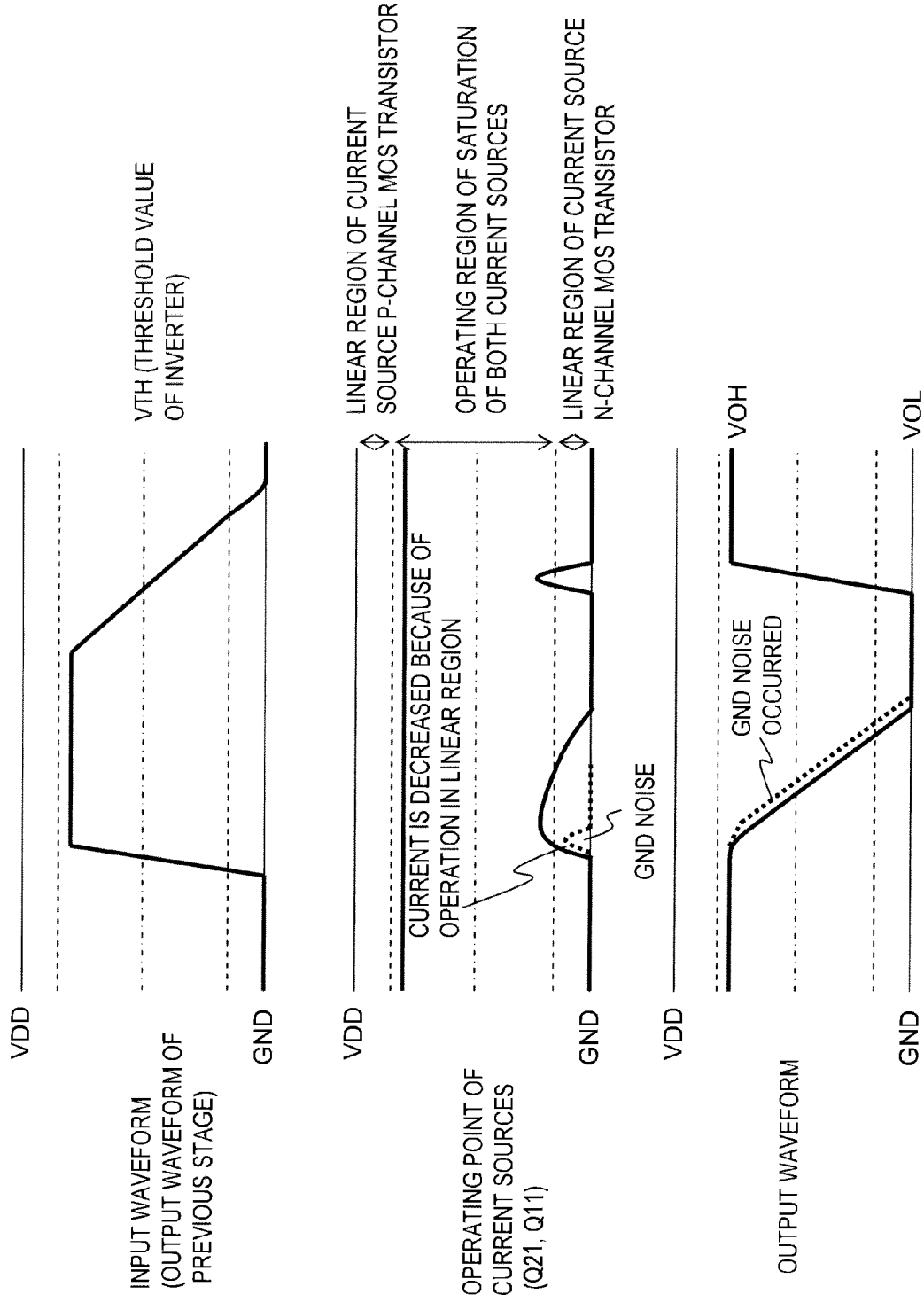

US 8,362,844 B2

DELAY CIRCUIT AND VOLTAGE CONTROLLED OSCILLATION CIRCUIT

REFERENCE TO RELATED APPLICATION

This application is based upon and claims the benefit of the priority of Japanese patent application No. 2009-290961, filed on Dec. 22, 2009, the disclosure of which is incorporated herein in its entirety by reference thereto.

TECHNICAL FIELD

This invention relates to a delay circuit and a voltage controlled oscillation circuit. More particularly, it relates to a delay circuit that inputs a pair of differential signals to output differential signals and to a voltage controlled oscillation circuit that uses the delay circuit.

BACKGROUND

In a semiconductor integrated circuit which uses a high precision clock signal, a PLL is widely used as a circuit that generates the high precision clock signal. This PLL uses a voltage controlled oscillator whose oscillation frequency or phase is controlled such as to generate the high precision clock signal. In a routine practice for constructing the voltage controlled oscillator, a plurality of delay circuits, whose delay time may be controlled by a voltage, are interconnected in a ring. The delay circuits are interconnected in the ring so that the last stage output signal will be phase-inverted with respect to the input signal of the initial stage so as to be fed back in this phase-inverted state to the initial stage input signal, thereby causing the oscillations. The oscillation frequency may be controlled by a voltage applied to a control terminal.

It is well-known that the delay circuit or the voltage controlled oscillator suffers from variations in the oscillation frequency or in the delay time by power supply noises. Among conventional measures taken to cope with this problem, there is such a measure disclosed in Patent Document 1. Specifically, Patent Document 1 shows a clock generation circuit provided with a delay circuit and a voltage controlled oscillator of the above type and which is able to generate a clock signal of small jitter against power supply voltage variations caused e.g., by power supply noises. FIG. 8 depicts a circuit diagram showing a conventional delay circuit and a conventional voltage controlled oscillator used in the PLL circuit disclosed in Patent Document 1. Referring to FIG. 8, a ring oscillator type oscillation circuit 41 includes three sets each made up of pair CMOS inverters and three voltage controlling MOS transistors Q11, Q12 and Q13 associated with the three sets. Each MOS transistor is provided common to the associated pair CMOS inverters. The CMOS inverters of each pair are constructed in the form of a differential circuit to execute a complementary operation. The pair inverter sets are arranged to form a ring oscillator. A differential amplifier is connected at the trailing stage to act as a buffer gate 42 to output differential signals as a single-ended signal. Since the ring oscillator type oscillation circuit 41 operates differentially, the operation margin may be improved. In addition, the gate voltages of the MOSFETs, connected in cascode, are lowered by voltage division to reduce the signal voltage of each CMOS inverter to raise the oscillation frequency.

Moreover, in this ring oscillator type oscillation circuit 41, a plurality of the MOSFETs, connected in cascode to the PMOS sides of the three sets of the CMOS inverters, is replaced by a single common MOSFET Q21, thereby decreasing variations of the signal amplitudes of the respective CMOS inverters.

Referring to FIG. 8, an N-channel MOS transistor Q10 forms a current mirror circuit with N-channel MOS transistors Q11 to Q13. That is, the currents proportionate to a current Iv flowing through the N-channel MOS transistor Q10 are controlled to flow through Q11, Q12 and Q13. The current Iv is a control current converted from a control voltage by a voltage-to-current converter, not shown, and controls the oscillation frequency of the oscillation circuit. The PMOS transistor Q21 is used for limiting the output amplitude of each inverter circuit. A constant bias voltage Vb is applied by a smoothing circuit 43 to the gate of the PMOS transistor Q21. This bias voltage determines the output voltages of the inverter circuits. In Patent Document 1, the smoothing circuit 43 has a longer CR time constant, so that, even if the power supply voltage VDD is changed with e.g., power supply noises, it is possible to prevent variations in the bias voltage to prevent variations in the output voltage of each inverter circuit and hence the variations in the delay time of each inverter circuit. In FIG. 8, each pair inverter circuit represents a delay circuit that delays the differential signals. Thus, FIG. 8 in its entirety represents the voltage controlled oscillator 41. In FIG. 8, the voltage-to-current converter, among the component elements of the voltage controlled oscillator, is not shown. It should be noted that a voltage-to-current converter, configured to prevent variations of the current Iv ascribable to power supply noises, is shown and described in Patent Document 1.

Patent Document 1

JP Patent Kokai Publication No. JP-A-9-223965

SUMMARY

The following analysis is made by the present invention. In a conventional delay circuit, described in Patent Document 1, and herein shown in FIG. 8, there is provided a circuit in which the value of a reference current Iv or an upper limit value of the oscillation amplitude as determined by a voltage Vb is not liable to be affected by power supply noises produced from time to time. However, if power supply noises are produced on the ground side, such that variations in the drain source voltage of each of the current source transistors Q11 to Q13 are produced, the currents flowing through the current source transistors Q11 to Q13 are affected to cause variations in the delay time of the delay circuit, thus possibly causing the jitter.

The reason for this will now be described. Referring to FIG. 8, the current source transistors Q11 to Q13 transition from the state where the current is allowed to flow to the state where the current is scarcely allowed to flow, or vice versa, depending on operating states of the inverter circuits. Referring to FIG. 9, the current source transistor operates in both the saturation region and the linear region depending on the current flow quantity. The waveform diagram of FIG. 10 shows the waveforms of a conventional delay circuit. At each rise and fall of an input waveform, the current source transistors Q11, Q12 and Q13 transition from a state where no current is allowed to flow in the linear region to a state where the current commences to flow in the linear region, thence to a state where the current is allowed to flow in a saturation region, thence to a state the current is allowed to flow in a smaller quantity in the linear region, and thence to a state where no current is allowed to flow in the linear region.

If power supply noises are produced from the ground side during the time the current is flowing in the linear region, the drain source voltage in each of the current source transistors Q11 to Q13 is varied to cause marked variations in the drain source current (FIG. 9). These variations in the drain source current may cause variations in the delay time of the delay circuit, thus possibly producing the jitter.

According to a first aspect of the present invention, there is provided a delay circuit that includes a delay unit including a first and a second power supply terminals, a pair of differential signal input terminals, and a pair of differential signal output terminals. The delay unit causes signals entered from the pair of differential signal output terminals to be delayed and output in this state at the pair of differential signal output terminals. The delay circuit also includes a current controller that includes a current control terminal and that exercises control to cause a source current controlled by the current control terminal to flow through the first power supply terminal and the second power supply terminal of the delay unit. The delay circuit further includes a voltage controller that exercises control to provide for a constant potential difference between the first power supply terminal and the second power supply terminal.

According to a second aspect of the present invention, there is provided a delay circuit including: a first inverter circuit that inputs one of differential input signals and that outputs one of differential output signals; and a second inverter circuit that inputs the other of the differential input signals and that outputs the other of the differential output signals. The delay circuit also includes: a first current source provided between a first power supply and a first power supply terminal of the first and second inverter circuits; and a second current source provided between a second power supply and a second power supply terminal of the first and second inverter circuits. The delay circuit also includes a variable resistance circuit provided between an output of the first inverter circuit and an output of the second inverter circuit. The variable resistance circuit includes a first node to which an output of the first inverter circuit is connected, a second node to which an output of the second inverter circuit is connected, a third node to which a first reference voltage is applied, and a fourth node to which a first control voltage that controls the resistance value between the first node and the second node is applied. The value of a resistance between the third node and the first node is substantially equal to the value of a resistance between the third and second nodes. The current allowed to flow through the first and second current sources are respectively controlled by a second and a third control voltages.

According to a third aspect of the present invention, there is provided a voltage controlled oscillation circuit including a plurality of delay units, each of the delay units including a first and a second power supply terminals, a pair of differential signal input terminals, and a pair of differential signal output terminals. The delay unit causes signals entered from said pair of differential signal input terminals to be delayed and outputs in this delayed state at said pair of differential signal output terminals. The voltage controlled oscillation circuit also includes a current controller including a current control terminal and exercising control to cause a source current controlled by the current control terminal to flow through the first power supply terminal and the second power supply terminal of each the delay unit. The voltage controlled oscillation circuit also includes a voltage controller that exercises control to provide for a constant potential difference between the first power supply terminal and the second power supply terminal of each the delay unit. These delay units are interconnected in a ring so that, based on input signals delivered from initial stage differential signal input terminals, output signals delivered from the last stage differential signal output terminals are phase-inverted and returned in this state to the initial stage differential signal input terminals.

The meritorious effects of the present invention are summarized as follows.

According to the present invention, there is provided, in a delay circuit whose delay time is controlled by the current allowed to flow, a voltage controller that exercises control to provide for a constant potential difference between the power supply terminals. It is thus possible to control the delay circuit so that the current source that causes controlled current to flow through power supply terminals will operate in saturation, thus suppressing the variations in delay time otherwise caused by power supply noises.

BRIEF DESCRIPTION OF THE DRAWINGS

FIG. 9 is a graph prepared based on an analysis by the present inventor for illustrating the variations of the current value against variations of the drain-source voltage in a saturation region and a linear region of a current source transistor in the conventional delay circuit of FIG. 8.

FIG. 10 is a waveform diagram of the conventional delay circuit of FIG. 8 prepared based on an analysis by the present inventor.

PREFERRED MODES

Figure 1:
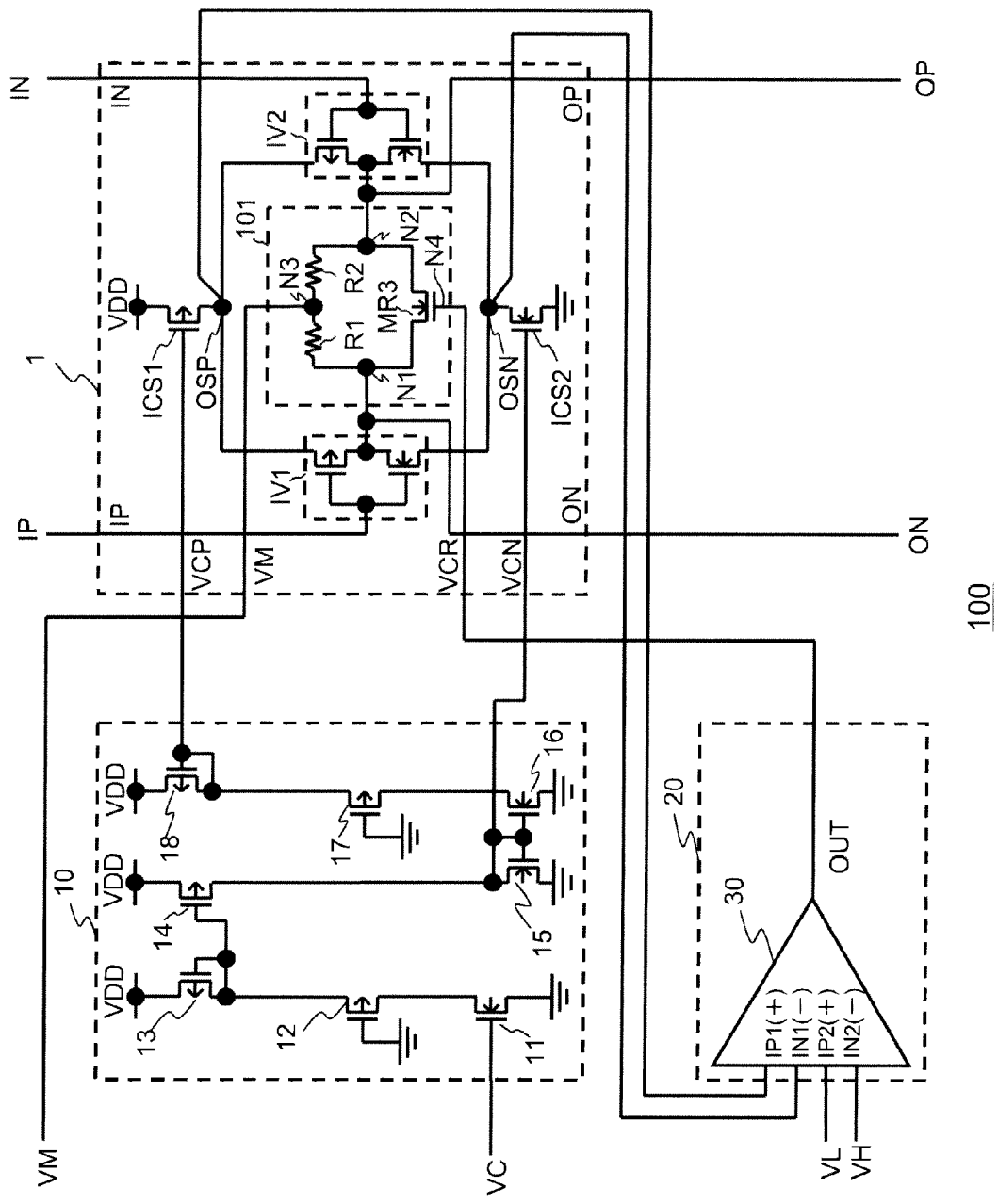
FIG. 1 is a circuit diagram of a delay circuit by Example 1 of the present invention.

Initially, schemata of an exemplary embodiment of the present invention will be described. It should be noted that drawings and numerals used therein, referred to in the explanation of the schemata, are only for the sake of illustration of the exemplary embodiment, and are not intended to limit possible variations of the exemplary embodiments.

Referring to FIGS. 1 and 5 to 7, a delay circuit (100, 100A, 100B, 200) according to an exemplary embodiment of the present invention includes a delay unit (1, 1B, 1-1 to 1-3). The delay unit includes, in turn, first and second power supply terminals (OSP, OSN), a pair of differential signal input terminals (IP, IN), and a pair of differential signal output terminals (ON, OP). The delay unit causes signals entered from the pair differential signal input terminals (IP, IN) to be delayed and output in this state at the pair differential signal output terminals (ON, OP). The delay circuit also includes a current controller 10 that has a current control terminal VC and that exercises control to cause the source current controlled by the current control terminal VC to flow through the first power supply terminal OSP and the second power supply terminal OSN of the delay unit (1, 1B, 1-1 to 1-3). The delay circuit also includes a voltage controller (20, 20A) that exercises control to provide for a constant potential difference between the first power supply terminal OSP and the second power supply terminal OSN. In the above formulation, the current controller controls the delay time of the delay unit. In addition, the delay circuit includes the voltage controller, whereby the potential at the power supply terminals may be maintained constant without dependency upon the voltage levels of the differential input signals or upon the operating state of the delay unit. Hence, the current source that delivers the current to the power supply terminals may be maintained in the saturated state without dependency upon the operating state of the delay unit.

The delay unit (1, 1B, 1-1 to 1-3) may include a first inverter circuit IV1 connected to the first and second power supply terminals (OSP, OSN), one IP of the pair of differential signal input terminals, and to one ON of the pair of differential signal output terminals. The delay unit may also include a second inverter circuit IV2 connected to the first and second power supply terminals (OSP, OSN), the other IN of the pair of differential signal input terminals and to the other OP of the pair of differential signal output terminals.

The delay unit (1, 1B, 1-1 to 1-3) may further include a variable resistance circuit (101, 101B) connected between one and the other (ON and OP) of the pair of differential signal output terminals. The voltage controller (20, 20A) preferably controls the resistance value of the variable resistance circuit (101, 101B) so that the potential difference between the first power supply terminal OSP and the second power supply terminal OSN will be constant irrespectively of the voltage level of the signals entered from the differential signal input terminals (IP, IN).

The variable resistance circuit (101, 101B) preferably includes a first resistance element (R1, MR1) connected between a reference voltage terminal VM and one ON of the pair differential signal output terminals. The variable resistance circuit may also preferably include a second resistance element (R2, MR2) connected between the reference voltage terminal VM and the other OP of the pair differential signal output terminals. The second resistance element is of a resistance value substantially equal to that of the first resistance element. In this formulation, in which the resistance value of the first resistance element is approximately equal to that of the second resistance element, output signals from the differential signal output terminals are oscillated about the voltage at the reference voltage terminal VM as a reference. This variable resistance circuit and the voltage controller operate for maintaining the voltages at the first and second power supply terminals constant. The first and second resistance elements may be fixed resistors or variable resistors. In case the first and second resistance elements are variable resistors, the resistance values of these resistance elements may not be the same depending on the conditions of applying a control voltage, for example, the voltage at the differential signal output terminals. It is however sufficient if the resistance values become approximately equal to each other in case the control voltage is applied under a corresponding condition.

Figure 5:
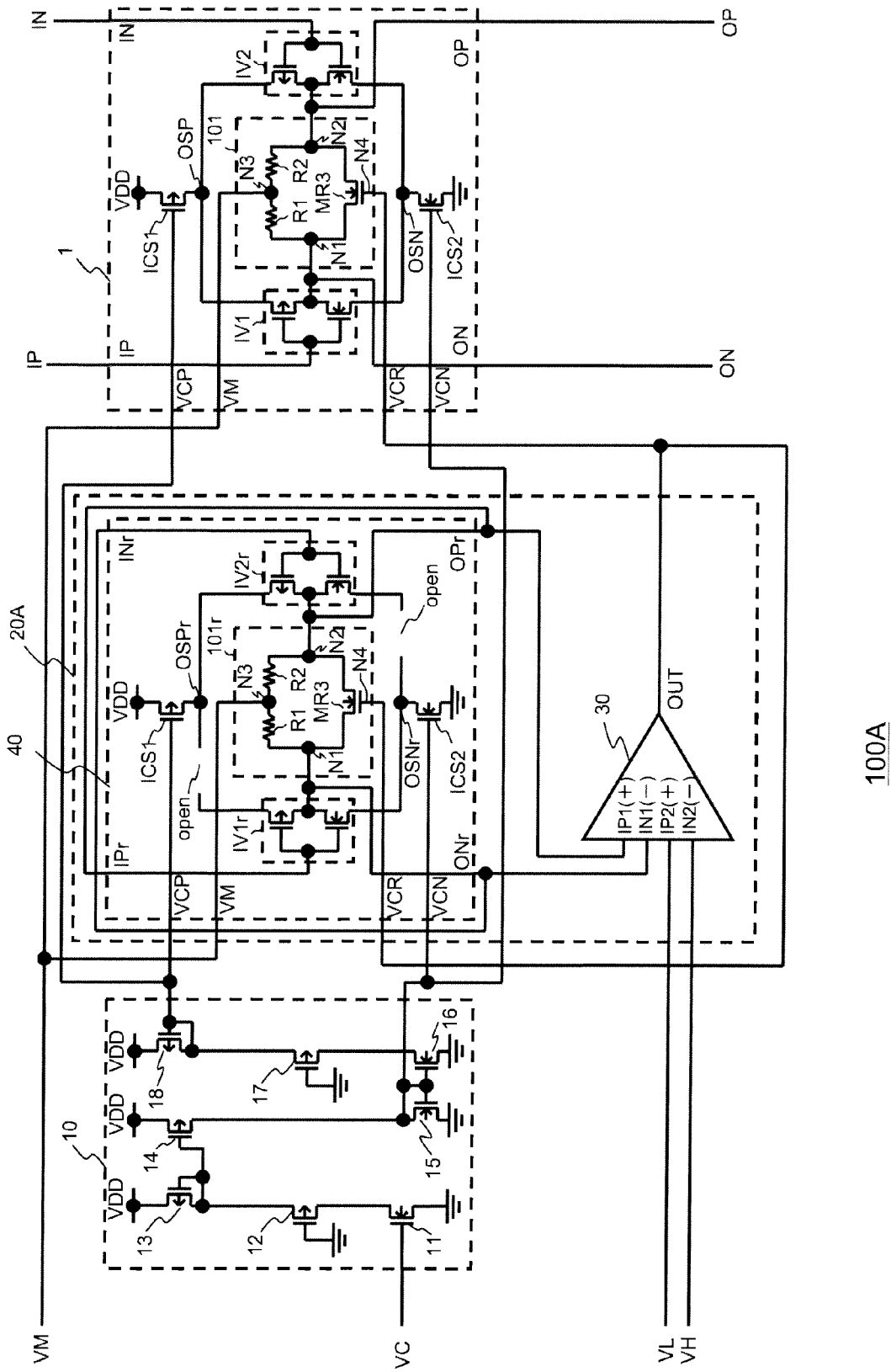
FIG. 5 is a circuit diagram of a delay circuit according to Example 2.
Figure 7:
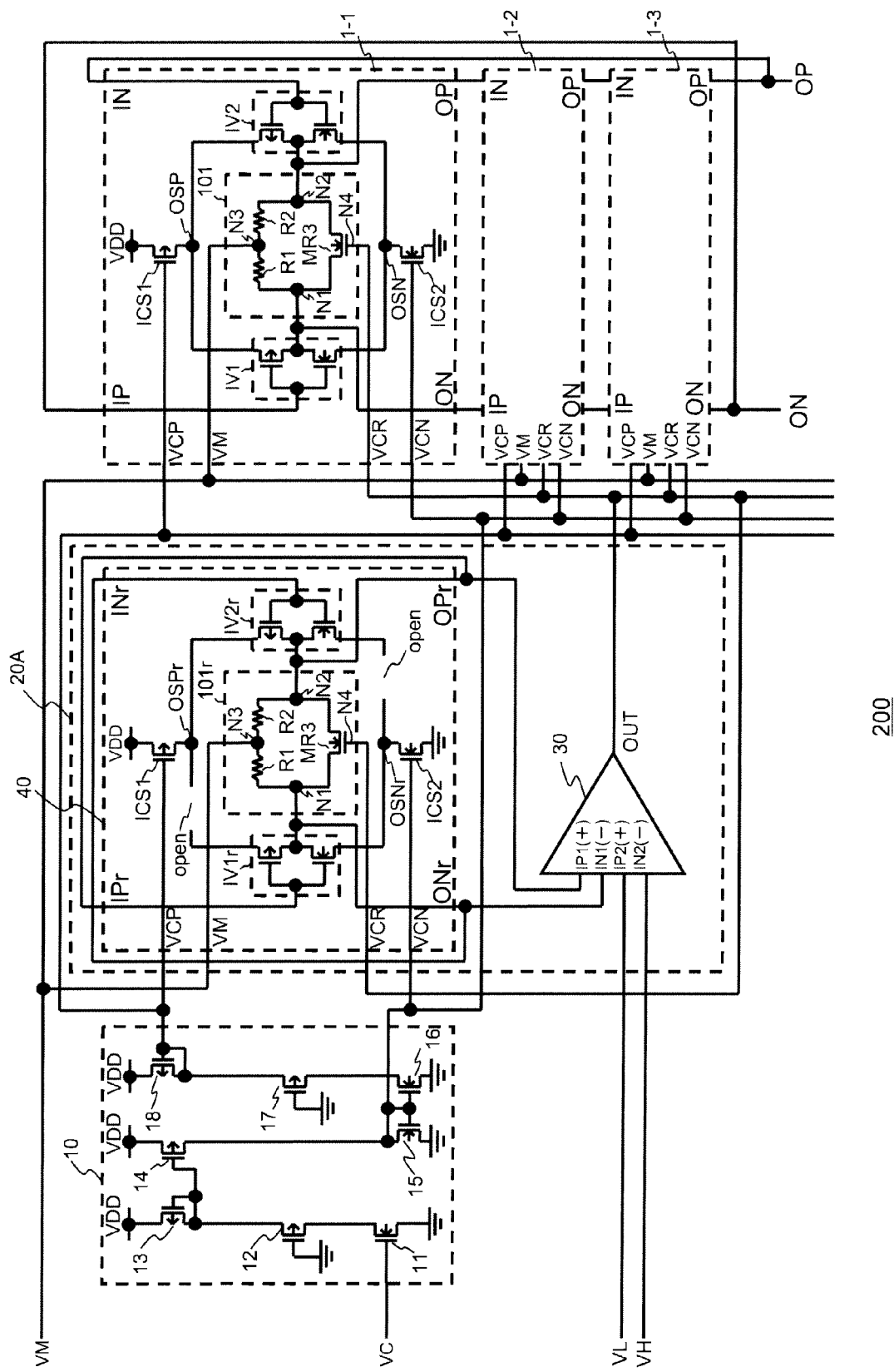
FIG. 7 is a circuit diagram of a voltage controlled oscillation circuit according to Example 4.
Figure 8:
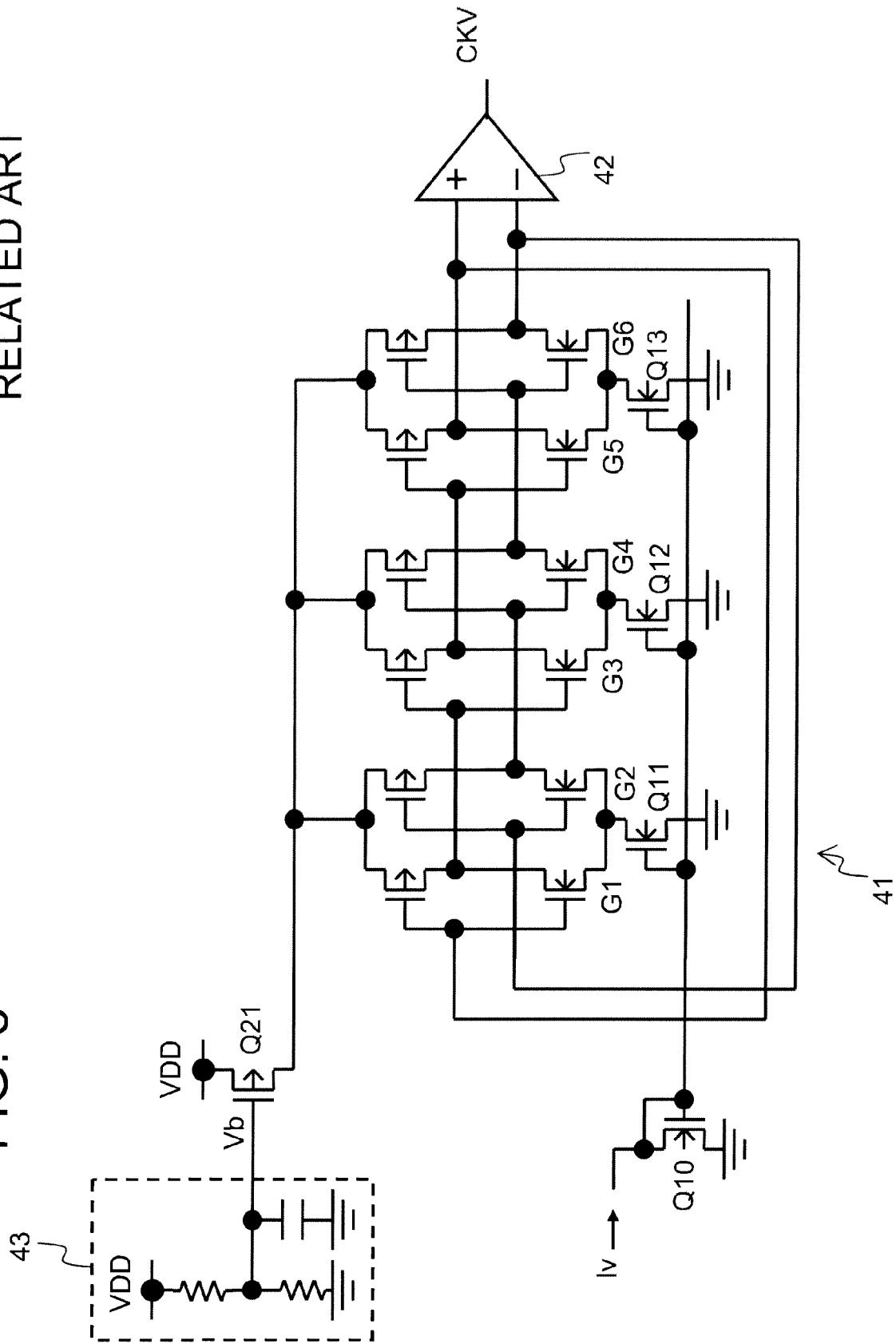
FIG. 8 is a circuit diagram of a conventional delay circuit and a conventional voltage controlled oscillation circuit.

Referring to FIGS. 5 and 7, showing Examples of the present invention, the voltage controller 20A preferably exercises control so that the potential difference between the first power supply terminal OSP and the second power supply terminal OSN will be increased or decreased in dependence upon the current value controlled by the current controller, and so that the potential difference will be constant without dependency upon the voltage levels of signals entered from the differential signal input terminals (IP, IN). In the Examples shown in FIGS. 5 and 7, the voltage controller 20A exercises control to provide for a constant potential difference between the differential signal output terminals (ONr, OPr) of a replica circuit 40 which is a replica (duplication) of the delay unit 1. The voltages at differential signal output terminals (ONr, OPr) of the replica circuit 40 are fixed, so that, if the potential difference between the differential signal output terminals (ONr, OPr) of the replica circuit 40 is constant, the potential difference between power supply terminals (OSPr, OSNr) of the replica circuit 40 also becomes constant. It is noted however that the potential difference between the power supply terminals (OSPr, OSNr) of the replica circuit 40 is increased or decreased depending on the current value controlled by the current controller. Since the delay unit 1 and the replica circuit 40 are of the same formulation, the potential difference between the first power supply terminal OSP and the second power supply terminal OSN of the delay unit 1 is controlled to be increased or decreased in dependence upon the current value controlled by the current controller. The potential difference between the power supply terminals OSP, OSN of the delay unit 1 is controlled to be substantially constant without dependency upon the voltage levels of the signals entered at the differential signal input terminals (IP, IN).

Still referring to FIGS. 5 and 7, showing Examples of the present invention, the replica circuit 40 of the delay unit 1, provided in the voltage controller 20A, is preferably of a constitution identical with the delay unit 1 except that one and the other (ONr and OPr) of the differential signal output terminals are respectively connected, in the manner of cross-connection, to the other and one (INr and IPr) of the differential signal input terminals in forming the replica circuit. The voltage controller preferably exercises control, based on the potential difference between the differential signal output terminals (ONr, OPr) of the replica circuit 40, so that the amplitudes of output signals at the differential signal output terminals (ON, OP) of the delay unit 1 will be constant.

Still referring to FIGS. 1 and 5 to 7, showing Examples of the present invention, the voltage controller (20, 20A) preferably further includes a differential amplifier circuit 30. The differential amplifier circuit inputs a set of voltage signals (IP1(+), IN1(−), IP2(+) and IN2(−) to control the resistance value of the variable resistance circuit (101, 101B) so that the potential difference between the first power supply terminal OSP and the second power supply terminal OSN will he constant. It should be noted that, in each Example, a four-input differential amplifier circuit is shown as a desirable formulation of the differential amplifier circuit 30. However, the differential amplifier circuit need not necessarily be in a four-input differential amplifier circuit configuration, It is only sufficient that the set of voltage signals is a set of two or more signals and that the resistance value of the variable resistance circuit is controlled to provide for a constant potential difference between the first and second power supply terminals based on the set of the voltage signals.

Figure 6:
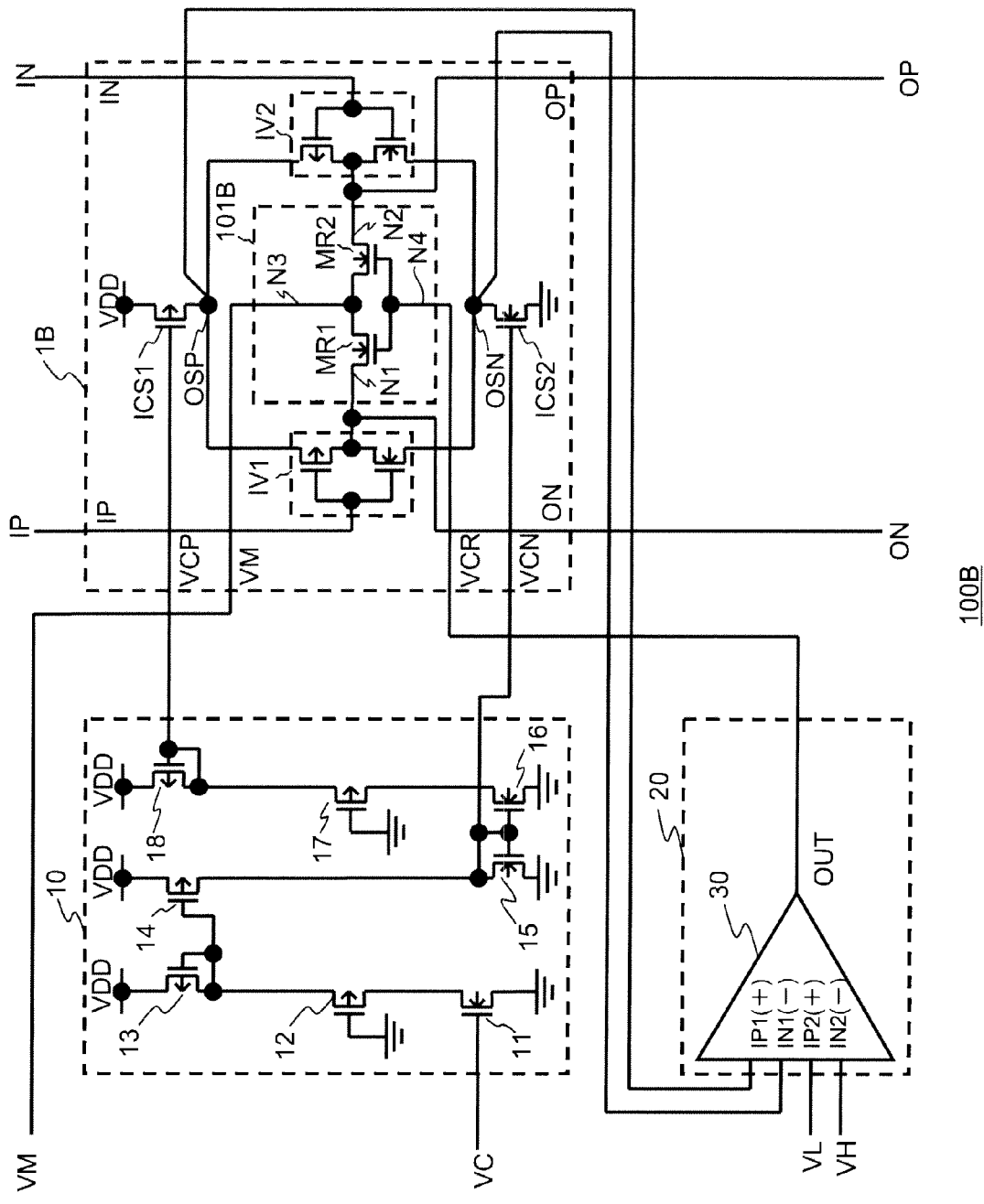
FIG. 6 is a circuit diagram of a delay circuit according to Example 3.

Referring further to FIGS. 1 and 6, showing Examples of the present invention, the voltage controller 20 includes a differential amplifier circuit 30 that has a first differential signal input terminal IP1(+), a second differential signal input terminal IN1(−) and an output terminal. The first differential signal input terminal IP1 (+) is connected to the first power supply terminal OSP, and the second differential signal input terminal IN1(−) is connected to the second power supply terminal OSN. The output terminal is connected to the resistance value control terminal VCR of the variable resistance circuit. The differential amplifier circuit 30 controls the resistance value of the variable resistance circuit 101 to provide for a constant potential difference between the first power supply terminal OSP and the second power supply terminal OSN.

Referring to FIGS. 5 and 7, showing Examples of the present invention, it is preferred that the voltage controller 20A further includes a replica circuit 40 of the delay unit 1, which is fixed in its operating state, and a differential amplifier circuit 30. The differential amplifier circuit has a first differential signal input terminal IP1(+), a second differential signal input terminal IN1(−) and an output terminal. The differential signal output terminals (OPr, ONr) of the replica circuit 40 are connected to the first differential signal input terminal IP1(+) and to the second differential signal input terminal IN1(−) of the differential amplifier circuit. The output terminals of the differential amplifier circuit 30 are connected to the resistance value control terminal VCR of the variable resistance circuit 101.

Referring to FIGS. 1 and 5 to 7, showing Examples of the present invention, it is preferred that the delay unit 1 further includes a first power supply circuit ICS1 connected to the first power supply terminal OSP, and a second power supply circuit ICS2 connected to the second power supply terminal OSN. The current controller 10 includes a current source circuit (11, 12) that controls the current quantity based on a voltage applied to the current control terminal VC. The current controller also includes a first current mirror circuit (16 to 18) that causes a constant circuit to flow through the first power supply circuit based on the current caused to flow through the current source circuit (11, 12). The current controller further includes a second current mirror circuit (13 to 15) that causes a current substantially equal to the current caused to flow through the first power supply circuit to flow through the second power supply circuit, based on the current caused to flow through the current source circuit.

It is preferred that the delay unit 1 further includes a current source transistor of the first conductivity type ICS1 that has a source connected to a first power supply VDD, has a drain connected to the second power supply terminal OSP and that has a gate voltage controlled by the current controller 10. The delay unit also includes a current source transistor of the second conductivity type ICS2 that has a source connected to a second power supply GND, has a drain connected to the second power supply terminal OSN and that has a gate voltage controlled by the current controller 10. The voltage controller controls the voltage at the first power supply terminal and that at the second power supply terminal so that both the current source transistor of the first conductivity type and the current source transistor of the second conductivity type will operate in the saturation region without dependency upon the voltage level of signals entered from the differential signal input terminals.

Referring to FIG. 7, showing an exemplary embodiment of the present invention, a voltage controlled oscillation circuit 200 includes a plurality of delay units (1-1 to 1-3) in the above described delay circuit (100, 100A, 100B). The delay units (1-1 to 1-3) are interconnected in a ring so that, based on input signals delivered from initial stage differential signal input terminals, output signals delivered from last stage differential signal output terminals are phase-inverted and returned in this state to the initial stage differential signal input terminals. Viz., a plurality of the delay units of the delay circuit are interconnected in a ring to provide a voltage controlled oscillation circuit. It is noted that the delay units of the delay circuit are interconnected in a ring with such phase setting that the output signal has its phase inverted and returned in this state to the input terminal.

Several Examples of the present invention will now be described in detail with reference to the drawings.

Example 1

FIG. 1 depicts a circuit diagram of a delay circuit 100 of Example 1. The delay circuit 100 includes a delay unit 1, a current controller 10 and a voltage controller 20. The delay unit 1 includes a pair of differential input terminals (IP, IN), a pair of differential output terminals (OP, ON), a first inverter circuit IV1 and a second inverter circuit IV2. The first inverter circuit IV1 includes an input terminal electrically coupled to one of the differential input terminals IP, and an output terminal electrically coupled to one of the differential output terminals ON. The second inverter circuit includes an input terminal electrically coupled to the other of the differential input terminals IN, and an output terminal electrically coupled to the other of the differential output terminals OP. The transistor sizes of the second inverter circuit are substantially equal to those of the first inverter circuit IV1. The delay unit 1 also includes a first current source ICS1 and a second current source ICS2. The first current source is provided between a first power supply VDD and a first power supply terminal OSP of the first inverter circuit IV1 and the second inverter circuits IV2. The second current source is provided between a second power supply GND and a second power supply terminal OSN of the first and second inverter circuits. The delay circuit further includes a variable resistance circuit 101 between the output terminal of the first inverter circuit and that of the second inverter circuit.

The first current source ICS1 includes a P-channel MOS transistor having a source terminal connected to the first power supply VDD, having a drain terminal connected to the first power supply terminal OSP and having a gate terminal connected to a first control voltage terminal VCP. The second current source ICS2 includes an N-channel MOS transistor having a source terminal connected to the second power supply GND, having a drain terminal connected to the second power supply terminal OSN and having a gate terminal connected to a second control voltage terminal VCN.

A variable resistance circuit 101 includes a pair of resistance elements (R1, R2) having substantially equal resistance values each other, and an N-channel MOS transistor MR3. The resistance element R1 is connected between nodes N1 and N3, while the resistance element R2 is connected between a node N2 and the node N3. The N-channel MOS transistor MR3 has its source-drain terminals connected to the nodes N1 and N2, respectively, while having its gate terminal connected to the resistance control terminal VCR. The node N3 is connected to a reference voltage terminal VM. The N-channel MOS transistor MR3 operates as a variable resistance element that controls the resistance value between the nodes N1 and N2 by the voltage applied to the resistance value control terminal VCR. In Example 1, the resistance elements R1, R2 are fixed resistors.

The current controller 10 includes N-channel MOS transistors 11, 15 and 16 and P-channel transistors 12, 13, 14, 17 and 18, while also including a current control terminal VC, first control voltage terminal VCP and the second control voltage terminal VCN. The first control voltage terminal VCP is connected to the first control voltage terminal VCP of the delay unit 1, and the second control voltage terminal VCN is connected to its second control voltage terminal VCN.

The current control terminal VC is connected to the gate of the N-channel MOS transistor 11 to control the current flowing through the N-channel MOS transistor 11 by the voltage applied to the current control terminal VC. The N-channel MOS transistors 11, 12 and the P-channel MOS transistors 13, 14 form a first current mirror circuit to cause a current proportionate to the current flowing through the source and the drain of the N-channel MOS transistor 11 to flow through the source and the drain of the P-channel MOS transistor 14.

The N-channel MOS transistors 15, 16 and the N-channel current source MOS transistor ICS2 of the delay unit 1 form a second current mirror circuit. The second current mirror circuit causes a current proportionate to the current flowing through the source and the drain of the N-channel MOS transistor 15 to flow through the source and the drain of the N-channel MOS transistor 16 and through the source and the drain of the N-channel current source MOS transistor ICS2 of the delay unit 1. It is noted that the transistor size of the N-channel MOS transistor 16 is substantially equal to that of the N-channel current source MOS transistor ICS2 of the delay unit 1. Hence, the current flowing through the source and the drain of the N-channel MOS transistor 16 is substantially equal to the current flowing through the source and the drain of the N-channel current source MOS transistor ICS2.

The P-channel transistor 18 forms a third current mirror circuit with the current source P-channel MOS transistor ICS1 of the delay unit 1. The transistor size of the P-channel MOS transistor 18 is substantially equal to that of the P-channel current source MOS transistor ICS1. With the current controller 10 and the current source transistors ICS1 and ICS2 of the delay unit 1, arranged as described above, the current flowing from the drain of the current source transistor ICS1 to the first power supply terminal OSP is controlled to be substantially equal to the current flowing from the second power supply terminal OSN to the drain of the current source transistor ICS2. The current value of the two currents is increased or decreased with the voltage applied to the current control terminal VC.

The voltage controller 20 includes a four-input differential amplifier circuit 30 including four input terminals and an output terminal OUT. These four input terminals include a first differential signal input terminal IP1(+), a second differential signal input terminal IN1(−), a first reference voltage input terminal IP2(+) and a second reference voltage input terminal IN2(−). The first differential signal input terminal IP1(+) is connected to the first power supply terminal OSP of the delay unit 1. The second differential signal input terminal IN1(−) is connected to the second power supply terminal OSN of the delay unit 1 and the output terminal OUT is connected to the resistance control terminal VCR of the delay unit 1. A reference voltage VL is supplied to the first reference voltage input terminal IP2(+), while another reference voltage VH is supplied to the second reference voltage input terminal IN2(−).

Figure 2:
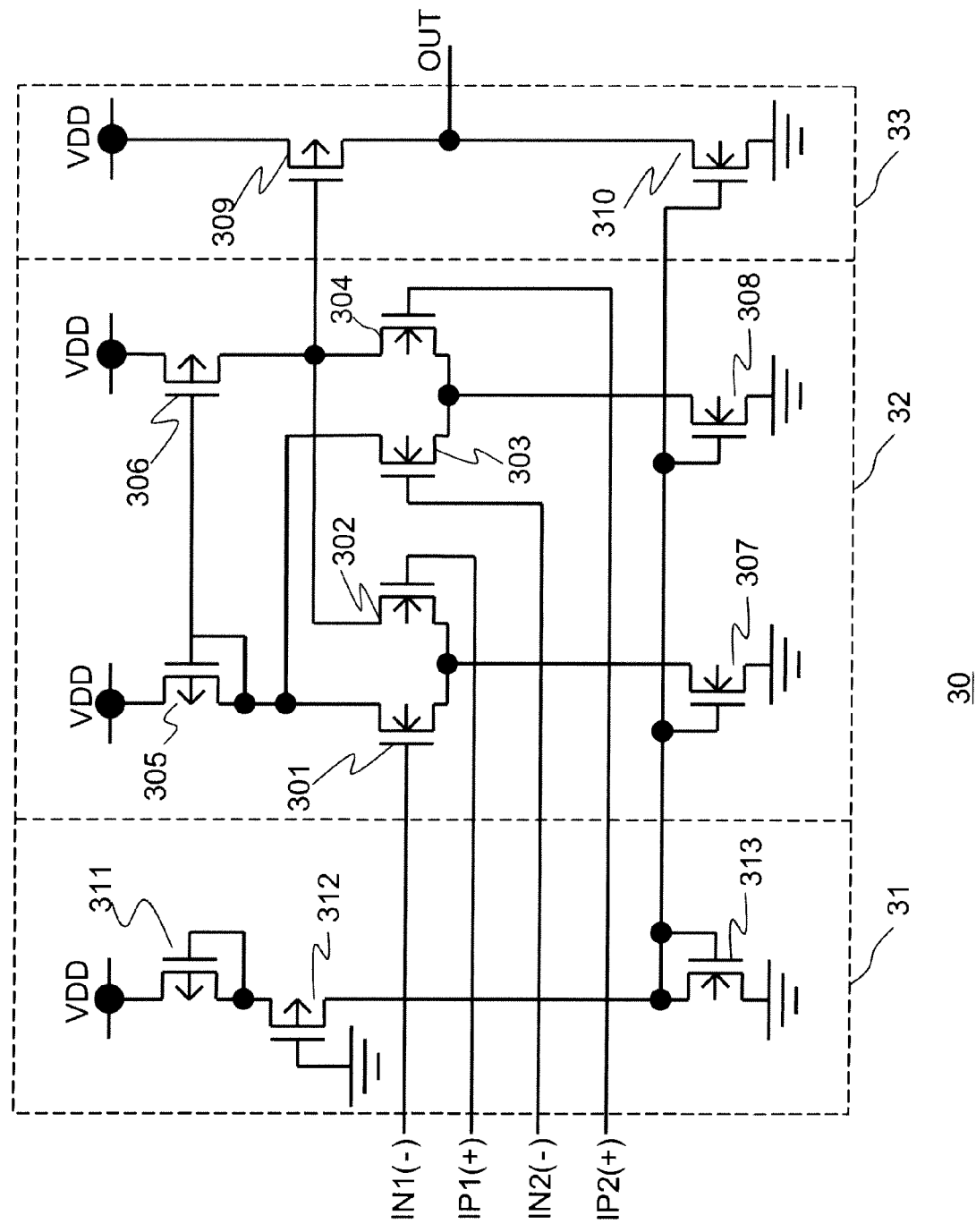
FIG. 2 is a circuit diagram of a differential amplifier circuit in Example 1.

FIG. 2 depicts a circuit diagram showing the four-input differential amplifier circuit 30. The four-input differential amplifier circuit includes the first differential signal input terminal IP1(+), second differential signal input terminal IN1(−), first reference voltage input terminal IP2(+), second reference voltage input terminal IN2(−) and the output terminal OUT. In addition, the four-input differential amplifier circuit includes a bias generator 31, a differential amplifier unit 32 and an output stage amplifier unit 33. The bias generator 31 includes P-channel MOS transistors 311, 312 and an N-channel MOS transistor 313, and transmits the bias voltage to the current source transistors of the differential amplifier unit 32 and to the output stage amplifier unit 33. The differential amplifier unit 32 includes P-channel MOS transistors 305, 306 and N-channel MOS transistors 301 to 304, 307 and 308, and outputs a signal corresponding to potential difference values of signals entered at the four input terminals. The output stage amplifier unit 33 includes a P-channel MOS transistor 309 and an N-channel MOS transistor 310 and amplifies an output signal of the differential amplifier unit 32 to output the amplified signal at the output terminal OUT.

The operation of the delay circuit 100 of Example 1 will now be described. The current value of the source current flowing through the current sources ICS1 and ICS2 of the delay unit 1 is labeled I and each of the resistance values of the resistors R1, R2 of the variable resistance circuit 101 is labeled R. The resistance value of the N-channel MOS transistor MR3, operating as a variable resistance element, is labeled RQ. The on-resistance of the N-channel MOS transistors of each of the pair inverter circuits IV1, IV2, having the same transistor size, is labeled RN, and that of each of the P-channel MOS transistors is labeled RP. Further, a reference voltage applied to a junction point of the series-connected pair resistance elements R1, R2 is labeled VM. The GND side terminal OSN and the VDD side terminal OSP of the inverter circuits IV1, IV2 are connected to current sources having a substantially equal current value, and exhibit a high impedance with respect to GND and VDD. Further, the resistance values of the pair resistance elements R1, R2 are substantially equal to each other, while the on-resistance values of the P-channel MOS transistors are substantially equal to each other and the N-channel MOS transistors of the pair inverter circuits IV1, IV2 are substantially equal to each other. Hence, the operating voltage VP of the current source ICS1 (or voltage at the first power supply terminal OSP) and the operating voltage VN of the current source ICS2 (or voltage at the second power supply terminal OSN) may be represented by the following equations (1) and (2):

$$VP = VM + I(RP + RN + 2R \cdot RQ/(2R + RQ))/2 \quad (1)$$

$$VN = VM - I(RP + RN + 2R \cdot RQ/(2R + RQ))/2 \quad (2)$$

On the other hand, Vds of the current source P-channel MOS transistor (Vds_P) and Vds of the current source N-channel MOS transistor (Vds_N) may be represented by the following equations (3) and (4), respectively:

$$Vds\_P = VP - VDD \quad (3)$$

$$Vds\_N = VN \quad (4)$$

The current controller 10 and pair current sources (ICS1, ICS2) of the delay unit 1 function as a voltage-to-current conversion circuit. The voltage of the current control terminal VC is converted into the current which then controls the delay of the delay unit 1.

In the four-input differential amplifier circuit 30 of the voltage controller 20, the input voltage of the first differential signal input terminal IP1(+) is labeled VIP1, and the input voltage of the second differential signal input terminal IN1(−) is labeled VIN1. Also, the input voltage of the first reference voltage input terminal IP2(+) is labeled VIP2, the input voltage of the second reference voltage input terminal IN2(−) is labeled VIN2, and the gain of an operational amplifier is labeled G. The output voltage Vout may then be expressed by the following equation (5):

$$Vout = G((VIP1 - VIN1) + (VIP2 - VIN2)) = G((VIP1 - VIN1) - (VIN2 - VIP2)) \quad (5)$$

From the equation (5), it is seen that the four-input differential amplifier circuit 30 amplifies the potential difference between (VIP1−VIN1) and (VIN2−VIP2). Hence, the output voltage of the four-input differential amplifier circuit is fed back so that the difference between the operating voltage of the first current source of the delay unit 1 (voltage VP) and the operating voltage of its second current source (voltage VN) will be substantially equal to the difference between VH and VL irrespectively of the current values of the current sources. The following equation (6) is thus held valid.

$$VP-VN=VH-VL \tag{6}$$

It is noted that the GND side terminal OSN and the VDD side terminal OSP of the pair inverter circuits IV1, IV2 are connected to current sources of the same current value, and exhibit a high impedance with respect to GND and VDD. It is also noted that the reference voltage VM is applied to a junction point N3 of the two resistance elements of substantially equal resistance values connected in series with outputs of the pair inverter circuits IV1, IV2. Hence, the operating voltages VP, VN of the first and second current sources are controlled so as to satisfy the equations (7) and (8):

$$VP=VM+(VH-VL)/2 \tag{7}$$

$$VN=VM-(VH-VL)/2 \tag{8}$$

By the equations (7) and (8), it is possible to adjust the operating voltages VP (voltage at the first power supply terminal OSP) and VN (voltage at the second power supply terminal OSN) based on the setting of the reference voltages VM, VH and VL. Hence, Vds of each of the first and second current sources (Vds_P and Vds_N) may be represented by the equations (9) and (10):

$$Vds\_P=VM+(VH-VL)/2-VDD \tag{9}$$

$$Vds\_N=VM-(VH-VL)/2 \tag{10}$$

From the equations (9) and (10), Vds of each of the first and second current sources may be set by setting the reference voltages VM, VL and VH. This setting may be made so that the current sources will operate in a region of saturation irrespectively of the current flowing through the delay circuit itself.

Meanwhile, to provide a wide operating range of the delay unit 1 with respect to the current of the current source to secure an output amplitude of the inverter, it is desirable to set the resistance values of RP, RN, RQ and R so that the equation (11) will be met.

$$RP=RN<<RQ<<R \tag{11}$$

Figure 3:
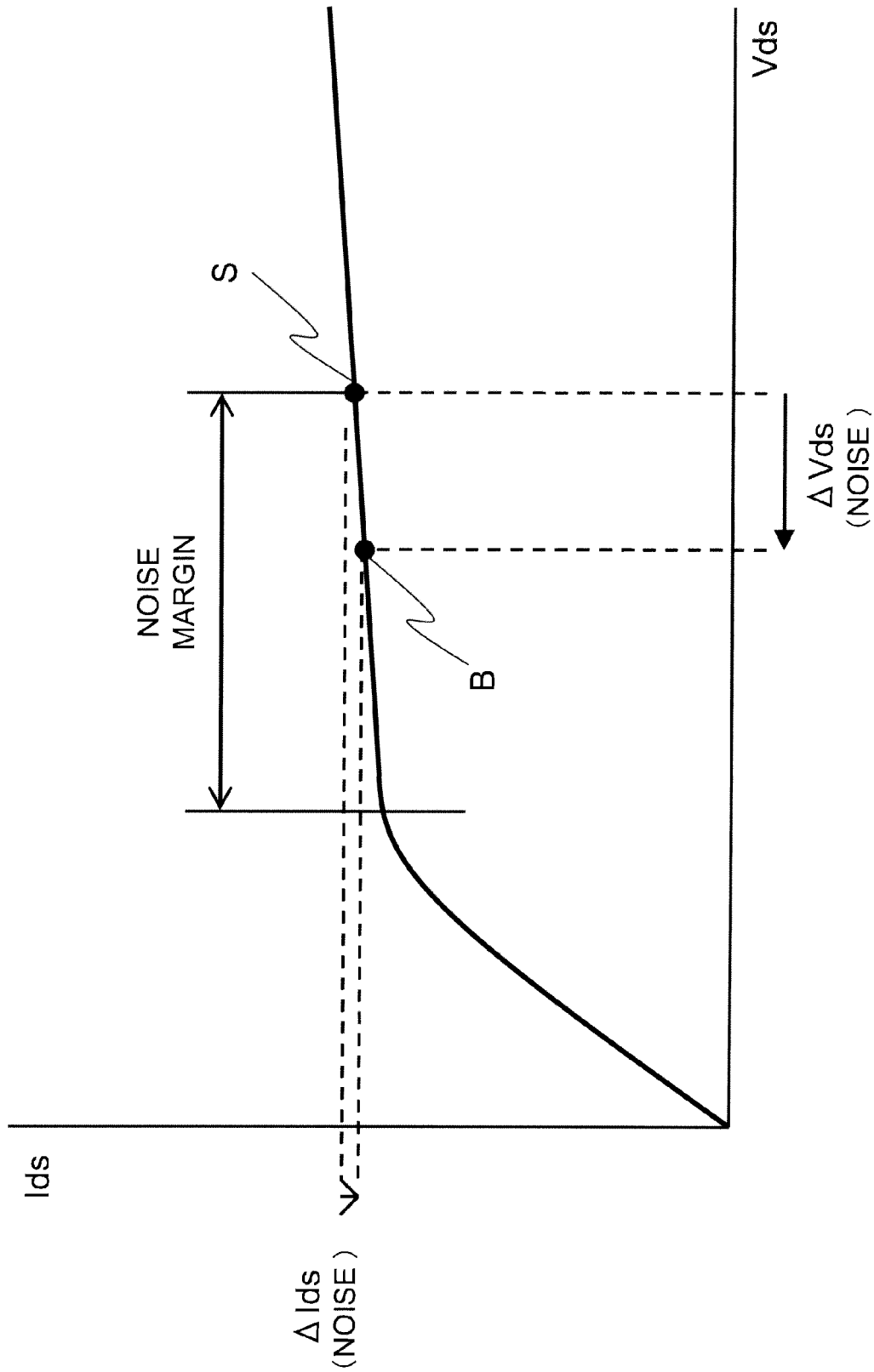
FIG. 3 is a schematic view for illustrating the operation of the delay circuit of FIG. 1 in case the noise has entered a current source of the delay circuit of FIG. 1.

The meritorious effect of Example 1 will now be explained. FIG. 3 depicts a graph for illustrating the operation when power supply noises entered the delay unit of Example 1. In this Example 1, the operating point of the current sources (ICS1 and ICS2) is set at a point S within a noise margin that commences at a point of transition from the linear region to the saturation region. It may be seen that, even if a noise (ΔVds) has been entered in Vds within the noise margin, and the operating point has been shifted from the point S to a point B, the current source transistor is in the saturation region, with the current change being only small.

Figure 4:
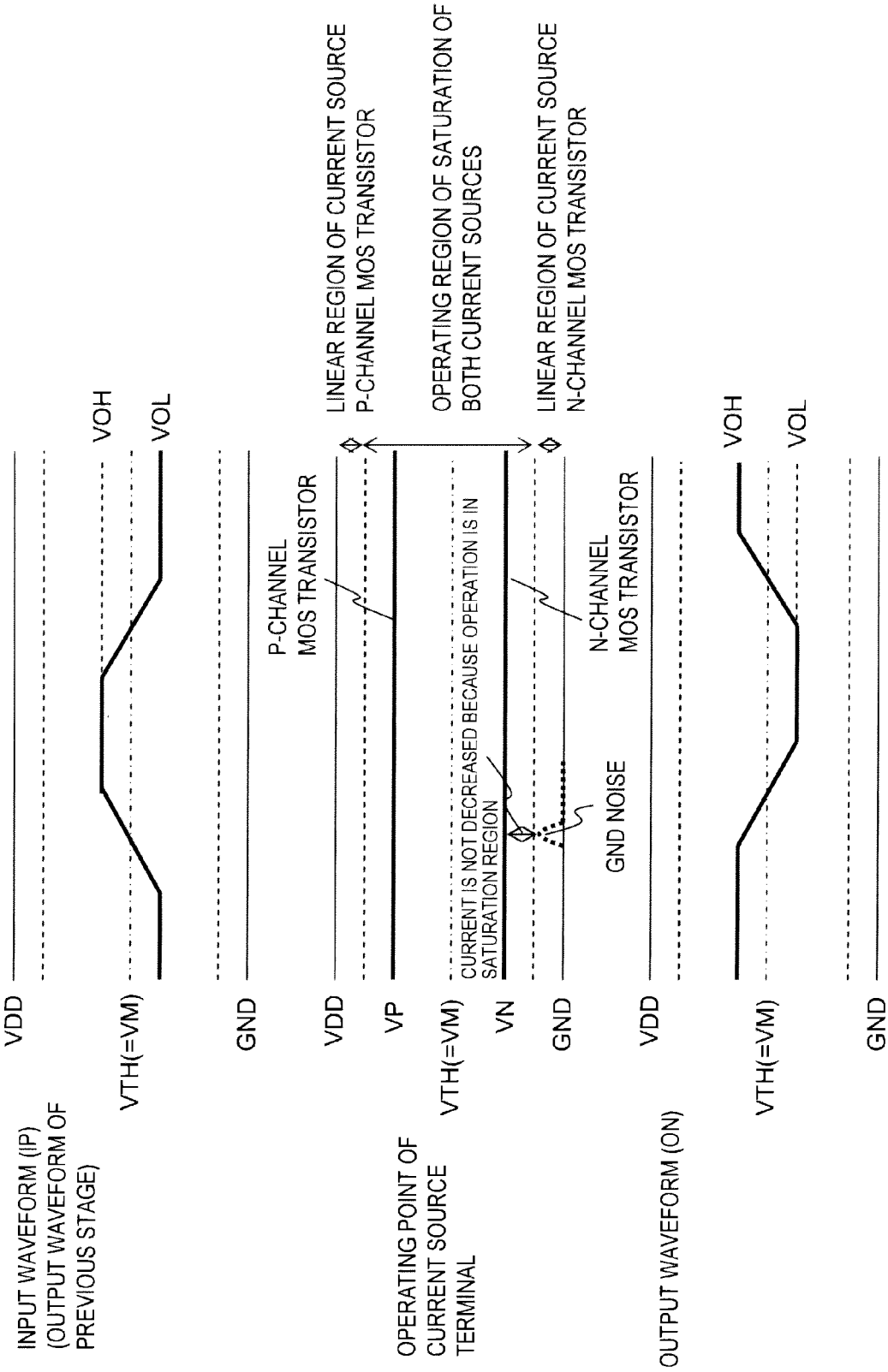
FIG. 4 is a waveform diagram for illustrating the operation of the delay circuit of FIG. 1.

FIG. 4 shows waveforms at respective nodes in the delay unit 1 at the time of occurrence of GND noises. In FIG. 4, it is presupposed that a plurality of the delay units of FIG. 1 are connected in cascade one with another. In such case, the input waveform (IP) of the inverter circuit IV1 is an output waveform of the inverter circuit of the previous stage. The potential difference between the power supply terminals OSP and OSN is suppressed by the voltage controller 20. Hence, the output amplitude of the inverter circuit is also oscillated in a suppressed voltage range between VOH and VOL. An input signal of the inverter circuit (output signal of the previous stage) is oscillated about the reference voltage VM, supplied from the reference voltage terminal VM, as a reference. On the other hand, the tilt of a rising edge of the input signal is determined by the current flowing through the current source transistor ICS1, while that of the falling edge is determined by the current flowing through the current source transistor ICS2. In Example 1, the current controller 10 exercises control so that the current flowing through the current source transistor ICS1 will be substantially equal to that flowing through the current source transistor ICS2. Hence, the tilt of the rising edge is basically equal to that of the falling edge.

The voltage at the operating point of the current source (voltage at the first power supply terminal OSP or that at the second power supply terminal OSN) transitions so as to be constant at all times in accordance with the equations (7) and (8) without dependency upon the operating states of the inverter circuits IV1, IV2. On the other hand, both the voltage VP of the operating point of the current source P-channel MOS transistor ICS1 and the voltage VN of the operating point of the current source N-channel MOS transistor ICS2 are in the saturation region. Hence, these voltages are hardly susceptible to adverse effects due to power supply noises, as explained with reference to FIG. 3. Referring now to FIG. 4, if the noise within the noise margin, denoted by a broken line, has been entered from the ground GND to the current source, such noise scarcely exhibits adverse effects as jitter, because the change in the current value is only small. This is in marked contrast to the conventional technique shown in FIG. 10 in which the operating point of the current source N-channel MOS transistor is moved back and forth from the linear region to the saturation region and vice versa depending on the operating state of the inverter circuit. It is noted that, in the conventional technique, shown in FIG. 10, if power supply noises occurred during operation in the linear region, the current flowing through the current source transistor is inevitably affected by such power supply noises, thus producing the jitter.

In the Example 1, described above, the reference voltages VH, VM and VL may be set so that the operating voltages of the current sources, that is, Vds of the current source transistors, may be made constant irrespectively of the values of the currents flowing through the inverter circuits per se. That is, by setting the reference voltages VH, VM and VL to such values that the transistors will operate in the saturation region with the noise margin, it is possible to provide a delay circuit less liable to be affected by the VDD or GND power supply noise.

Example 2

FIG. 5 depicts a circuit diagram of a delay circuit 100A of Example 2. This Example 2 is in no way different from Example 1 in that the delay circuit 100A includes the delay unit 1, the current controller 10 and a voltage controller 20A. However, the present Example 2 differs slightly from Example 1 as to the formulation and the operation of the voltage controller 20A. Since the formulation and operation of the delay unit 1 and those of the current controller 10 are the same as those of Example 1, the same reference numerals as those of Example 1 are used to denote these components, and detailed description thereof is dispensed with.

The voltage controller 20A of the delay circuit 100A of Example 2, shown in FIG. 5, includes a replica circuit 40, a duplication circuit of the delay unit 1, in addition to the differential amplifier circuit 30. The replica circuit 40 is constructed so as to be similar to the delay unit 1 as to its circuit formulation and circuit characteristics. The replica circuit 40 differs from the delay circuit 1 as to connection of the input/output terminals. An output terminal ONr of an inverter circuit IV1r of the replica circuit 40 is connected to an input terminal INr of its other inverter circuit IV2r. An output terminal OPr of the inverter circuit IV2r is connected to an input terminal IPr of the inverter circuit IV1r. A VDD side power supply line of the inverter circuit IV1r is not connected to the first power supply terminal OSPr and remains open. In similar manner, a ground GND side power supply line of the inverter circuit IV2r is not connected to the second power supply terminal OSNr and remains open. Hence, the replica circuit 40 is fixed in a state in which the inverter circuit IV1r outputs a LOW level and in which the inverter circuit IV2r outputs a HIGH level. As to other structures and connections, the replica circuit 40 is the same as the delay unit 1.

The output terminal OPr of the inverter circuit IV2r of the replica circuit 40 is connected to the first differential signal input terminal IP1(+) of the differential amplifier circuit 30. The output terminal ONr of the inverter circuit IV1r is connected to the second differential signal input terminal IN1(−). As to other structures and connections, the differential amplifier circuit 30 is the same as in Example 1.

It may be said that, due to the above difference in formulation, the voltage controller 20 of Example 1 exercises control with the operating voltage of the current source of the delay unit 1 in mind, whereas the voltage controller 20A of Example 2 exercises control mainly with the operating amplitude of the delay unit 1 in mind. In Example 1, if the current of the current source is increased, viz., the delay is decreased, the amplitude becomes smaller, thus imposing a load on the amplification to be performed in the next stage circuit. This restricts the range of possible variations of the delay quantities. In Example 2, on the other hand, such a meritorious effect may be obtained that the range of possible variations of the delay quantity may be widened by maintaining the constant operating amplitude. If conversely the current of the current source is increased, Vds of the current source is decreased to narrow down the range of operation in the saturation region. However, by setting the on-resistance of the inverter circuit to an extremely small value, the operating voltages VN, VP of the first and second current sources become closer to the output voltages VOL, VOH of the delay unit 1, respectively. The operating characteristics of Example 2 are approximately equal to those of Example 1. In both of the Examples, the operating range in the saturation region of the current sources may be made compatible with the range of variations of the delay value.

In controlling the operating amplitude of the inverter circuit to be constant, it is necessary to sense VOL and VOH of the differential output signals of the delay unit. It is however difficult to directly sense VOL and VOH of the differential output signals of the delay unit 1 because the voltages at OP and ON are varied in the operating states. Thus, in Example 2, the replica circuit 40 of the delay unit 1 is provided in the voltage controller 20. The other (OPr) of the differential output signal terminals is connected to one (IPr) of the differential input signal terminals. One (ONr) of the differential output signal terminals is connected to the other (INr) of the differential input signal terminals. By so doing, the voltages that are substantially equal to VOL and VOH of the differential output signals of the delay unit 1 are generated at the differential output signal terminals (ONr, OPr) of the replica circuit 40. The so generated voltages are sensed by the four-input differential amplifier circuit 30. In short, the four-input differential amplifier circuit 30 senses the voltages VOL, VOH, generated by the replica circuit 40, and controls the resistance values of the variable resistance circuits of the replica circuit 40 and the delay unit 1 so that the following equation (12) will be met.

$$\text{operation amplitude} = VOH - VOL = VH - VL \quad (12)$$

Meanwhile, to determine VOL, VOH, the replica circuit 40 is designed and constructed so that one of the pair inverter circuits generating the voltage VOL has its power supply terminal open, while the other inverter circuit, generating the voltage VOH, has its GND terminal open.

With the present Example 2, the output amplitudes of the inverter circuits IV1 and IV2 become constant voltages. The potential difference across the first power supply terminal OSP and the second power supply terminal OSN depends on the currents allowed to flow through the first current sources ICS1 and ICS2 of the delay unit 1 and on the on-resistances of the inverter circuits IV1 and IV2. However, if the preferred delay time of the delay circuit is determined at the outset, as when the delay circuit is used in a PLL, the values of the currents allowed to flow through the current sources ICS1 and ICS2 are determined at the outset. Hence, the output amplitude is constant, so that, if the on-resistance of the inverter circuit is decreased, the potential difference across the first power supply terminal OSP and the second power supply terminal OSN may be controlled by the voltage controller 20A so as to be within a preset range.

Example 3

FIG. 6 depicts a circuit diagram of a delay circuit 100B of Example 3. The present Example 3 differs from Example 1 as to the formulation of a variable resistance circuit 101B of a delay unit 1B. Except for this difference, the present Example 3 is the same in the formulation and the operation as the Example 1. The variable resistance circuit 101B of the delay circuit 100B in Example 3 includes N-channel MOS transistors MR1 and MR2. These transistors MR1, MR2 are used as variable resistance elements. The N-channel MOS transistor MR1 has its source-drain path connected between nodes N1 and N3, while the N-channel MOS transistor MR2 has its source-drain path connected between nodes N2 and N3. A resistance value control terminal VCR is connected to the gates of the transistors MR1 and MR2. The node N3 is connected to the reference voltage terminal VM, as in Example 1.

The operation as itself of the variable resistance circuit 101B is basically similar to that of Example 1. Viz., the operating voltages VP and VN of the current sources may be adjusted based on setting of the reference voltages VM, VH and VL. Hence, Vds of the current sources ICS1, ICS2 may be set so that these current sources may be in operation in the saturation region irrespectively of the current flowing through the delay unit main (inverter circuits IV1, IV2). It is thus possible to provide a delay circuit not liable to be affected by VDD or GND noises. As a matter of course, the variable resistance circuits 101, 101r of Example 2 shown in FIG. 5 may be replaced by the variable resistance circuit 101B shown in Example 3.

Example 4

FIG. 7 depicts a circuit diagram of a voltage controlled oscillation circuit 200 of Example 4. In the present Example 4, a plurality of the delay units 1 (1-1 to 1-3) are provided in the delay circuit 100A of Example 2. These delay units 1 (1-1 to 1-3) are provided in series one with another. The output of the last stage delay unit 1-3 is coupled to the input of the initial stage delay unit 1-1 so that the output of the last stage delay unit 1-3 has its logic state inverted at the initial stage delay unit, thereby forming a ring oscillator. An oscillation output is taken out as a pair of differential signals at the pair of differential output signal terminals (ON, OP). The oscillation frequency is controlled by a voltage applied from the current control terminal VC. With the present Example 4, the amplitude of the operation of the delay units 1 (1-1 to 1-3) may be kept constant to allow providing a broad range of the oscillation frequency. Moreover, by decreasing the on-resistance of the inverter circuit, it is possible to set a broad range of operation in the saturation region of the current sources to provide a voltage controlled oscillation circuit suffering from only small adverse effects ascribable to jitter of power supply noises or GND noises. If a plurality of the delay units (1-1 to 1-3) are provided in Example 4, a single current controller 10 and a single voltage controller 20A may be provided in common for the delay units to prevent the number of component elements from increasing. As a matter of course, the delay circuits used in Example 4 may be the delay circuits of any of Examples 1 to 3 combined together.

In each of the above described Examples, the delay unit includes a pair of CMOS inverter circuits that input a pair of differential signals. However, the delay units need not necessarily include the pair of CMOS inverter circuits. For example, the delay unit may includes a single differential delay circuit that inputs and outputs differential signals.

Also, in the above described Examples, the current source is provided on each of the positive and negative power supply sides. Such an arrangement having the current source on each of the positive and negative power supply sides is desirable since it is then possible to prevent the noise from the positive or negative power supply side from turning around to the opposite side. However, the current source may be provided on only the positive or negative power supply side, in which case the present invention may similarly be applied to advantage.

In the above Examples, the delay circuit is applied to a voltage controlled oscillator. However, the present invention is not limited to the case of using the delay circuit in the voltage controlled oscillator. In particular, the delay circuit that inputs differential signals and that has the delay time controlled by voltage may be used in a DLL (Delay Locked Loop), as an example.

Other preferred modes (forms) of the present invention may be listed as follows:

(Mode 1)

A delay circuit comprising a first inverter circuit (IV1) that inputs one (IP) of differential input signals and that outputs one (ON) of differential output signals;

a second inverter circuit (IV2) that inputs the other (IN) of the differential input signals and that outputs the other (OP) of the differential output signals;

a first current source (ICS1) provided between a first power supply (VDD) and a first power supply terminal (OSP) of the first and second inverter circuits;

a second current source (ICS2) provided between a second power supply (GND) and a second power supply terminal (OSN) of the first and second inverter circuits; and a variable resistance circuit (101) provided between an output of the first inverter circuit and an output of the second inverter circuit;

the variable resistance circuit (101) including a first node (N1) to which an output of the first inverter circuit is connected, a second node (N2) to which an output of the second inverter circuit is connected, a third node (N3) to which a first reference voltage (VM) is applied, and a fourth node (N4) to which a first control voltage (VCR) that controls the resistance value between the first node (N1) and the second node (N2) is applied; the value of a resistance between the third node (N3) and the first node being substantially equal to the value of a resistance between the third and second nodes; the current allowed to flow through the first and second current sources being respectively controlled by a second and a third control voltages (VCP, VCN).

(Mode 2)

The delay circuit according to mode 1, wherein the variable resistance circuit includes first, second and third resistance elements (R1, R2 and MR3); the first resistance element being provided between the first and third nodes; the second resistance element being provided between the second and third nodes; the third resistance element being provided between the first and second nodes; the third resistance element having its resistance value controlled by the first control voltage (VCR).

(Mode 3)

The delay circuit according to mode 1 or 2, further comprising a current controlling circuit 10; the current controlling circuit 10 generating, from a fourth control voltage (VC), the second and third controlled voltages (VCP, VCN), and exercising control so that the values of currents caused to flow through the first and second current sources will be substantially equal to each other.

(Mode 4)

The delay circuit according to any one of modes 1 to 3, further comprising a voltage controlling circuit 20;

the voltage controlling circuit 20 including a differential amplifier circuit 30 having a first positive-phase input terminal (IP1), a first reverse-phase input terminal (IN1), a second positive-phase input terminal (IP2) and a second reverse-phase input terminal (IN2); wherein when the voltage levels entered to the first positive-phase input terminal (IP1), first reverse-phase input terminal (IN1), second positive-phase input terminal (IP2) and the second reverse-phase input terminal (IN2) are labeled VIP1, VIN1, VIP2 and VIN2, respectively, all being real numbers, the differential amplifier circuit 30 amplifies a difference between (VIP1−VIN1) and (VIN2−VIP2) and outputs the resulting amplified difference;

the first power supply terminal (OSP) is connected to the first positive-phase input terminal (IP1); the second power supply terminal (OSN) is connected to the first reverse-phase input terminal (IN1);

a second reference voltage (VH) is applied to the second positive-phase input terminal (IP2); a third reference voltage (VL) is applied to the second reverse-phase input terminal (IN2); and wherein an output of the differential amplifier circuit is applied to the fourth node (N4) as the first control voltage (VCR).

(Mode 5)

The delay circuit according to any one of modes 1 to 4, further comprising a replica circuit 40 of the delay circuit according to mode 1, wherein in the replica circuit 40, one (IP) of differential input signals is coupled to the other (OP) of differential output signals; the other (IN) of the differential input signals is coupled to one (ON) of the differential output signals; one (ON) of the differential output signals outputs VOL; and the other (OP) of the differential output signals outputs VOH.

(Mode 6)

The delay circuit according to mode 1, wherein the variable resistance circuit 101 includes a first resistance element (MR1) and a second resistance element (MR2);

the first resistance element is provided between the first and third nodes;

the second resistance element is provided between the second and third nodes; an wherein the resistance values of the first and second resistance elements are controlled by the first control voltage (VCR).
(Mode 7)
The delay circuit according to any one of modes 1 to 6, wherein
the resistances whose resistance values are controlled by the first control voltage (VCR) are MOS transistors.
(Mode 8)
A voltage controlled oscillation circuit including a plurality of the delay circuits according to any one of modes 1 to 7, wherein
the delay circuits are interconnected in a ring so that differential output signals of each of the delay circuits will become differential input signals of the next stage delay circuit.

Although the present invention has been described with reference to certain Examples thereof, the present invention is not to be limited to the configuration of these Examples. It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modification aforementioned.

What is claimed is:

1. A delay circuit comprising:
a delay unit including a first and a second power supply terminals, a pair of differential signal input terminals, and a pair of differential signal output terminals; said delay unit causing signals entered from said pair of differential signal input terminals to be delayed and output in this delayed state at said pair of differential signal output terminals;
a current controller including a current control terminal and exercising control to cause a source current controlled by said current control terminal to flow through said first power supply terminal and said second power supply terminal of said delay unit; and
a voltage controller that exercises control to provide for a constant potential difference between said first power supply terminal and said second power supply terminal,
wherein said voltage controller exercises control so that a potential difference between said first power supply terminal and said second power supply terminal will be increased or decreased in dependence upon a current value controlled by said current controller and so that said potential difference will be constant without dependency upon voltage levels of signals entered from said differential signal input terminals.

2. The delay circuit according to claim 1, wherein said delay unit includes
a first inverter circuit connected to said first and second power supply terminals, one of said pair of differential signal input terminals, and to one of said pair of differential signal output terminals; and
a second inverter circuit connected to said first and second power supply terminals, the other of said pair of differential signal input terminals and to the other of said pair of differential signal output terminals.

3. The delay circuit according to claim 1, wherein
said delay unit further includes a variable resistance circuit connected between the one and the other of said pair of differential signal output terminals;
said voltage controller controlling a resistance value of said variable resistance circuit so that a potential difference between said first power supply terminal and said second power supply terminal will be constant irrespectively of voltage levels of signals entered from said differential signal input terminals.

4. The delay circuit according to claim 3, wherein
said variable resistance circuit includes a first resistance element connected between a reference voltage terminal and the one of said pair of differential signal output terminals and a second resistance element connected between said reference voltage terminal and the other of said pair of differential signal output terminals; said second resistance element being of a resistance value substantially equal to that of said first resistance element.

5. The delay circuit according to claim 1, wherein said voltage controller further includes a replica circuit of said delay unit; said replica circuit being of a constitution identical with said delay unit except that one and the other of said differential signal output terminals of said delay unit are respectively connected, in a manner of cross-connection, to the other and one of said differential signal input terminals in forming said replica circuit; said voltage controller exercising control, based on a potential difference between said differential signal output terminals of said replica circuit, so that amplitudes of output signals at said differential signal output terminals of said delay unit will be constant.

6. The delay circuit according to claim 3, wherein
said voltage controller further includes a differential amplifier circuit that inputs a set of voltage signals to control the resistance value of said variable resistance circuit so that the potential difference between said first power supply terminal and said second power supply terminal will be constant.

7. The delay circuit according to claim 3, wherein
said voltage controller further includes a differential amplifier circuit; said differential amplifier circuit including a first differential signal input terminal connected to said first power supply terminal, a second differential signal input terminal connected to said second power supply terminal, and an output terminal connected to a resistance value control terminal of said variable resistance circuit; said differential amplifier circuit controlling the resistance value of said variable resistance circuit to provide for a constant potential difference between said first and second power supply terminals.

8. The delay circuit according to claim 3, wherein
said voltage controller further includes a replica circuit of said delay unit; said replica circuit being fixed in an operating state thereof; and
a differential amplifier circuit including a first differential signal input terminal, a second differential signal input terminal and an output terminal;
a pair of differential signal output terminals of said replica circuit being connected to said first and second differential signal input terminals of said differential amplifier circuit; said output terminal of said differential amplifier circuit being connected to a resistance value control terminal of said variable resistance circuit.

9. The delay circuit according to claim 1,
wherein said delay unit further includes:
a first power supply circuit connected to said first power supply terminal; and
a second power supply circuit connected to said second power supply terminal, and wherein said current controller further includes:
    a current source circuit that controls a current quantity based on a voltage applied to said current control terminal;
    a first current mirror circuit that causes a constant current to flow through said first power supply circuit based on the current caused to flow through said current source circuit; and
a second current mirror circuit that causes a current substantially equal to the current caused to flow through said first power supply circuit to flow through said second power supply circuit, based on said current caused to flow through said current source circuit.

10. The delay circuit according to claim 1, wherein said delay unit further comprises:
    a current source transistor of a first conductivity type that has a source connected to a first power supply, has a drain connected to said first power supply terminal and that is controlled a gate voltage by said current controller; and
    a current source transistor of a second conductivity type that has a source connected to a second power supply, has a drain connected to said second power supply terminal and that is controlled a gate voltage by said current controller, and
wherein said voltage controller controls a voltage at said first power supply terminal and a voltage at said second power supply terminal so that both said current source transistor of the first conductivity type and said current source transistor of the second conductivity type will operate in a saturation region without dependency upon voltage levels of signals entered from said differential signal input terminals.

11. The delay circuit according to claim 1, further comprising:
a plurality of said delay units, said plurality of said delay units being connected in series, inputting a pair of differential signals into a pair of differential signal input terminals of an initial stage of said delay units, and outputting a pair of delayed differential signals to a pair of differential signal output terminals of a last stage of said delay units.

12. A delay circuit comprising:
a delay unit including a first and a second power supply terminals, a pair of differential signal input terminals, and a pair of differential signal output terminals; said delay unit causing signals entered from said pair of differential signal input terminals to be delayed and output in this delayed state at said pair of differential signal output terminals;
a current controller including a current control terminal and exercising control to cause a source current controlled by said current control terminal to flow through said first power supply terminal and said second power supply terminal of said delay unit; and
a voltage controller that exercises control to provide for a constant potential difference between said first power supply terminal and said second power supply terminal,
wherein said voltage controller further includes a replica circuit of said delay unit; said replica circuit being of a constitution identical with said delay unit except that one and the other of said differential signal output terminals of said delay unit are respectively connected, in a manner of cross-connection, to the other and one of said differential signal input terminals in forming said replica circuit; said voltage controller exercising control, based on a potential difference between said differential signal output terminals of said replica circuit, so that amplitudes of output signals at said differential signal output terminals of said delay unit will be constant.

* * * * *